US006313768B1

(12) United States Patent
Allen (10) Patent No.: US 6,313,768 B1
(45) Date of Patent: Nov. 6, 2001

(54) SYSTEM AND METHOD FOR TRACE DIAGNOSTICS OF TELECOMMUNICATIONS SYSTEMS

(75) Inventor: Dowell Allen, Boca Raton, FL (US)

(73) Assignee: Siemens Information and and Communications Networks, Inc., Boca Raton, FL (US)

( * ) Notice: Subject to any disclaimer, the term of this patent is extended or adjusted under 35 U.S.C. 154(b) by 0 days.

(21) Appl. No.: 09/540,183

(22) Filed: Mar. 31, 2000

(51) Int. Cl.[7] ................................................. H03M 7/00
(52) U.S. Cl. ............................................................ 341/78
(58) Field of Search ............................... 341/78, 79, 51; 704/500; 385/612, 611

(56) References Cited

U.S. PATENT DOCUMENTS 4,866,445 * 9/1989 Valero ..................................... 341/78
6,154,156 * 11/2000 Tagato .................................... 341/78

* cited by examiner

Primary Examiner—Brian Young (57) ABSTRACT

A system and method for decoding telecommunication tracer information originating from any telecommunication network element and utilizing any commercial or proprietary telecommunication protocol. The system includes a storage repository for storing trace data that includes a plurality of individual events provided by a telecommunications network element that utilizes one or more telecommunications protocol. An encoder creates and stores a plurality of executable programs used to decode the trace data. A decoder engine receives trace data from the storage repository, determines the telecommunication protocol or protocols associated with the trace data, and invokes one or more executable programs stored in the catalog encoder subsystem to decode the trace data. A graphical user interface that receives an output from said decoder engine and displays the decoded results.

11 Claims, 10 Drawing Sheets

```
DMPISDNTRAC;

ISDN TRACER : DLU PORT DATA

START DATE/TIME = 99-06-29 16:02:51                                    99-06-29  16:11:49
203—ISDN TRACER : COLLECTED DATA  202c   202
              ALDL/ALDLMIXJDS3/USOCBRV0019/103
              ‾202a  ‾202b
M 7191        RCMAC/SCAT1              3091/01777
      222  224
      T P TCB SUB EVENT   EV EV        STATE                           TRACE
220{  RE NO SEGM USR CLASS ID NO JC1 JC2 ADDR  DATA                    TIME
      H' 225                H' H' H'   H'     H'
    -+--+-+----+------+--------+--+--+---+----+--------------------+--------
209{ 2  2  4610 01  SILCMSG  84        49  D4 02CB  207⏜CD0B01225A    4B011400
     1  2  4630 06  SYNMSGI  BB D2           207⏜02047D6E000B0019    4B844076
                                             207⏜0200000000000000
                                                  0000000000000003            }208
209{ 2  1  4608 06  GSEV     47 61     99     04C6                    4B011340
     1  1  461B 06  SILCMSG  84 F3           0540                     4B844004
                                             ⏝
                                             207
```

FIG. 2B

```
                                               97-12-03  15:38:49
AUST/AUSTIX65WMD/USMOBL4V0014/103 ~202
M 179B    RCMAC/SYSTEM1      3091/01933

DMPISDNTRAC;

ISDN TRACER : COLLECTED DATA
                                                              ~204
      226
       ⌐T  TCB EVENT   EV EV           STATE                  TRACE
  220 ⌐ RE PORT SEGM CLASS ID NO JC1 JC2 ADDR DATA             TIME
       ⌐             H'    H' H' H'  H'  H'   H'
      ----+----+----+----+----+----+----+----+----+----+----+----+
  225⌐
       10 96        TIMEV    45 6A  14 01 A5  6A  0A0B ⌐2C2E78447087390C 15080896
                                                   207⌐146C0A0045030 2C0
                                                        800000000000000
       10 96        ORDEV0   14 6A  0D 20 02  0907 ⌐044B60AB0900         15078904
  209 ⌐                                             207
       10 96        SYNMSG0               02  0907 ⌐030E03021700 0107   15078900
                                                    207⌐0000000000000001
      ----+----+----+----+----+----+----+----+----+----+----+----+
                                                              ⌐207
                                                              }208
INTERRUPTION TEXT JOB  1798
```

Decoder Output for C:\iTAS\traces\t13_isd1.txt

TRACER = ISDN  RELEASE = 14.E APSNAME = USMOBL4V0009
PRONAME = BOYN CLLI = *234578901*

EVENT_NUMBER = 1 EVENT_CLASS = SILCCMD
JC1 =
JC2 = 49
T_RE = 2  P_NO = 1
TCB_SEGM =
TCB_TYP =
EV_ID =
EV_NO = 06
STATE_ADDR. = 0186 TIME = 62954488

DATA: 8F 08 01 01 7D 08 03 82 E3 36 14 01 08

```
DECODE:                           572
         570          ┌─────────────────────────────────┐
      ┌────┴────┐     ISDN_MAIN
   8F    10001111     .TEI = 143
   08    .0001000     .PROTOCOL_DISCRIMINATOR = Q.931 USER NETWORK
                                                CALL CONTROL MESSAGES
                      LENGTH_OF_CALL REFERENCE_VALUE = 1
   01    .0000001     .CALL_REFERENCE = 1
         0.......     .FLAG = ORIGINATOR OF CALL
   7D    .1111101     .MESSAGE_TYPE = MISCELLANEOUS: STATUS

08                 CAUSE
                      LENGTH_OF_CAUSE_INFO_ELEMENT = 3
   82    ....0010     .GENERAL_LOCATION = PUBLIC NETWORK SERVING LOCAL USER
         ...0....     .SPARE = 0
         .00.....     .CODING_STANDARD = CCITT-STANDARD
         1.......     .EXT = 1
   E3    .1100011     .CAUSE_VALUE = PROTOCOL_ERROR_CLASS.INFORMATION
                                     ELEMENT NON-EXISTENT OR NOT IMPLEMENTED
         1.......     .EXT = 1
   36    00110110     .DIAGNOSTICS = 54

14                 CALL_STATE
                      CALL_STATE_CONTENTS_LENGTH = 1
   08    .0001000     .CALL_STATE_VALUE = CONNECT REQUEST
```

SYSTEM AND METHOD FOR TRACE DIAGNOSTICS OF TELECOMMUNICATIONS SYSTEMS

CROSS-REFERENCE TO RELATED APPLICATION

This application is related in subject matter to co-pending U.S. patent application Ser. No. 09/540,184 filed concurrently herewith by Dowell Allen for "Method and System of Encoding and Decoding Tracer Information", and assigned to a common assignee herewith. Co-pending U.S. patent application Ser. No. 09/540,184 is incorporated herein by reference.

BACKGROUND OF THE INVENTION

1. Field of the Invention

The present invention generally relates to providing a system and method for telecommunication system trace diagnostics and, more particularly, to a system and method that encodes and decodes telecommunication system tracer information from any number of a plurality of tracer protocols.

2. Background Description

The swift advance of telecommunications technology over the latter half of the twentieth century promises a future in which a broad suite of services is available to the network user. These services cover a wide spectrum of activities encompassing traditional telephony and computer data transmission as well as the integration of these activities. The future user of telecommunications technology can expect digital telephony, high-speed data transmission, real-time video, high fidelity audio, and the combination of these activities into multimedia products all to be readily available over a network that interconnects users throughout the world.

In the first half of the twentieth century telephony architecture developed along the lines of a circuit-switched network providing audio communication to potentially every person in the world. Then, Private Branch eXchanges (PBXs) that provide a local telephone network within a building but that also retain access to the larger global network were developed. PBXs represent an example of a network within a network.

With the advent of the personal computer in the 1970's, development of approaches and architectures leading to the internetworking of computers in a manner analogous to the internetworking of telephones was begun. Motivated by the desire to distribute resources among users who may communicate with each other, Local Area Networks (LANs) allowing a local interconnection of computers were developed. They may be thought of as being analogous to the PBXs. The recognition that users within one LAN may wish to communicate with users in a separate LAN led to the development of Wide Area Networks (WANs), which may be thought of as a network of networks. Such networking of personal computers has led to new user services such as electronic mail and electronic file sharing.

Because telecommunications equipment, including everything from routers and switches to telephones and personal computers, comprises a wide range of purposes, the telecommunications industry has formulated the Open Systems Interface (OSI) model to provide a basis for developing and coordinating standards for internetworking systems developed by a variety of vendors/users. This approach models the telecommunications process as a structure of seven layers. These layers address, in turn, the physical connection, the data link, network functions, transport and data flow, session management, presentation, and finally the application, as basic features of an end-to-end communication process. The basis for the workability of a telecommunications network is the set of rules for communicating known as the protocol. Various protocols exist for each layer of the OSI model and are necessitated by the desire to connect different physical devices (e.g., telephones, personal computers) to multiple pipelines (e.g., copper wire, fiber optics) according to a variety of switching approaches (e.g., circuit switching, packet switching) with different performance criteria (e.g., low latency for telephone, low error rate for data exchange) for a wide variety of end-user applications.

In addition to the user-based network functions (e.g., transmission of voice or data), each network requires a system for controlling the network in a fashion transparent to the user. For example, when a person picks up the telephone to place a call, a signal is sent to the telephone company to alert it that a user wishes to make a call, and a response is sent back to the user in the form of a dial tone to indicate that the required network resources are available. This communication, which is essentially invisible to the caller, is an example of the kind of control functions that are necessarily implemented in the operation of any network. For the telephone network, the control system is known as Signaling System Number 7 (SS7). As implemented, SS7 comprises a suite of protocols, each of which serves a specific function in controlling the network. For example, the protocol named the Message Transfer Part (MTP) insures that traffic flows through the network by redirecting traffic around failed or overloaded nodes. Another SS7 protocol is the Transaction Capabilities Part (TCAP), which is used in querying any databases that are utilized in controlling the network. Because of its nature as a control system, SS7 is not necessarily limited to use in telephone networks. SS7 and the techniques associated with it are proving useful in more general telecommunications networks. It is clear that network control is an important and potentially complex aspect of telecommunications networking operations.

A critical function in the control of any network, be it a LAN, a PBX, or the Internet, is the management of network resources in order to diagnose and troubleshoot problems, to monitor system performance and to assess traffic patterns and loads. One of the tools commonly available to assist the network engineer in fulfilling a part of this management function is a software application generically known as a tracer. A tracer is a software program that outputs a record of network events (i.e., a trace) in order to aid the engineer in troubleshooting network operations. Due to the variety of technologies that contribute to a modern telecommunications network, a network engineer may be required to utilize a broad array of tracer programs in order to troubleshoot and diagnose problems that can occur in the various aspects of the network. A tracer used to query a telephone network necessarily obtains different information than a tracer used to query a LAN. Moreover, because a given type of network (e.g., LAN) may be manufactured by multiple vendors, each of whom may choose different protocols (unless constrained to the use of industry standard protocols, such as the SS7 suite of protocols) for use within the network, tracer programs must interact with a wide variety of telecommunications protocols. The network engineer must be conversant with the operation and utilization of many tracer programs interacting with a variety of protocols in order to implement the required network management functions.

Typically, the outputs from tracer programs that execute on Network Elements (NEs) are in hexadecimal or binary format and can comprise a plurality of telecommunications protocols. Current practice in decoding the outputs from tracer programs into readable format using a decoder software program generally provides only limited decoding. Thus, a decoder program may be written to decode the SS7 protocol suite or a part thereof Similarly, a decoder program may be written to decode the ISDN protocol or a part thereof, and should proprietary protocols on a NE exist, then there may be other decoder programs to handle the decoding of those proprietary protocols are parts thereof. The net result in troubleshooting or diagnosing a problem on a NE using tracers may well require the use of a variety of tracers, none of which provide an integrated view of all the protocols that a particular tracer may use. Thus, current practice does not provide for unification of all tracers into a common tool set, neither does current practice provide for the integration of the plurality of protocols that a particular tracer may use. Unification of multiple tracers supported on a given NE into a common tool set would provide the advantage of a coherent and consistent display presentation across all such tracers in addition to reducing training requirements. Further, an integrated display of a plurality of telecommunications protocols that can occur in any given tracer output would provide the advantage of a single view of all tracer events in context. Thus, with integration, the flow of tracer events in relationship with each other will facilitate and potentially make the diagnostic process more efficient.

What is needed therefore is a system and method by which any number of network tracer programs utilizing possibly multiple telecommunications protocols can be unified and integrated into one trace diagnostic network management tool that is both flexible, in order to accommodate existing tracers and protocols, and extensible, in order to accommodate as yet undeveloped tracers and protocols.

SUMMARY OF THE INVENTION

It is therefore an object of the invention to provide a system and method for the unification and integration of digital telecommunication systems' trace diagnostics.

It is another object of the invention to provide a system and method that unifies a plurality of tracers, each of which can log events that conform to a plurality of protocols, into a common tool-set.

It is another object of the invention to provide a system and method that provides an integrated view of the events that occur within a trace of a telecommunications system Network Element (NE) such as a telephony switch, wherein the trace events themselves may conform to a plurality of protocols.

According to the invention, an integrated trace and analysis system includes a plurality of Catalog Definition Language (CDL) catalogs (i.e., program modules), wherein one or more catalogs defines a particular protocol. For example, the ISUP protocol in the suite of SS7 protocols requires a minimum of two catalogs, whereas other SS7 protocols only require one catalog. The CDL that is used in defining and expressing catalogs is disclosed in co-pending patent application Ser. No. 09/540,184. A catalog can be compiled and executed under the control of a decoding engine, and consists of a set of frames that contains the instructions (i.e., operation codes or op-codes) to be executed to effect decoding. Catalogs are compiled and executed under the control of a parsing and decoding engine.

A trace is a time sequence of events that occurs within a Network Element (NE), such as a telephony switch, and is captured to a log file by a tracer program that executes on the NE. Tracers (i.e., tracer programs) capture traces, and are activated and de-activated on the NE by an engineer/administrator. The trace file results from the execution of the tracer, and typically is in either hexadecimal or binary format. The trace file is provided as input to the decoder engine for decoding.

A catalog encoding process is responsible for the generation of CDL catalogs. The catalog encoding process utilizes one of two methods for the generation of catalogs. One method utilizes a code generator to automatically generate catalog modules. The code generator accesses an electronic data source such as a relational database that contains the information required to enable catalog generation. The other method is to manually encode catalogs utilizing, for example, a text editor. The generated catalogs are stored in a file system, and a relational database is used in the management and administration of a library of catalogs.

A further advantage of the invention is that the Catalog Definition Language (CDL) is extensible, allowing it to evolve with the evolution of Network Elements (NEs) and the software running on the NEs. The CDL is extensible because new op-codes can be easily created and added to the language if required by any given telecommunication protocol.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
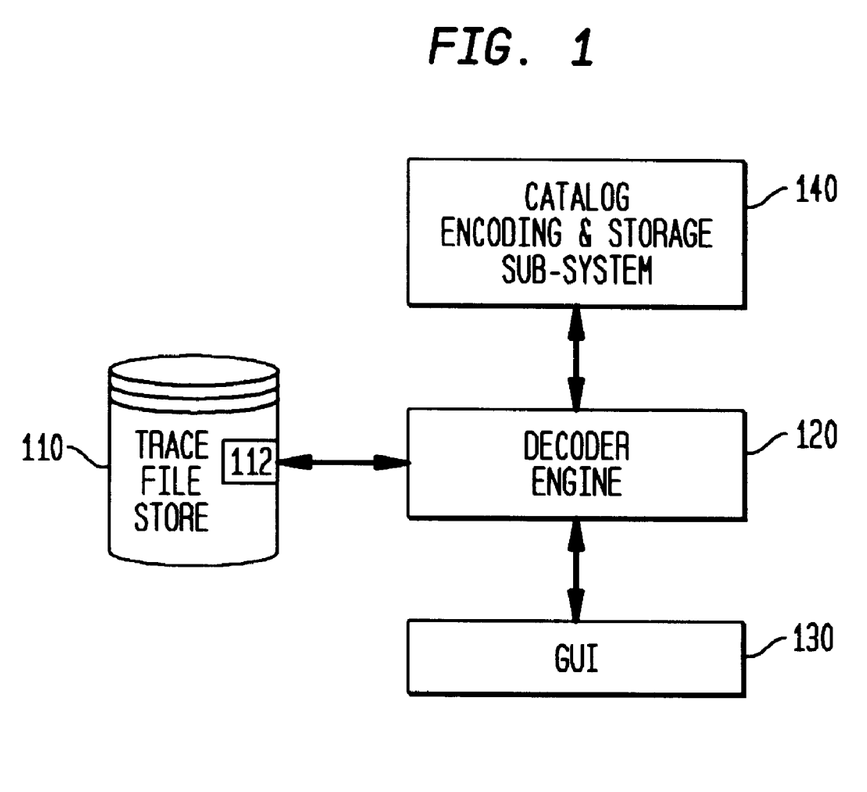
FIG. 1 is a high-level block diagram of the integrated trace analysis system according to the present invention.

Referring now to the drawings, and more particularly to FIG. 1, there is shown a high-level block diagram of the integrated trace analysis system according to the claimed invention. The integrated trace analysis system will be described by way of examples wherein the system decodes tracer information.

The integrated trace analysis system may be implemented on a desktop personal computer (PC) or a workstation, although other standalone or networked microcomputers, minicomputers, or mainframe computers can be utilized to practice the invention to suit particular applications and requirements. In FIG. 1, trace file store 110 represents a file system from which the decoder engine 120 can retrieve captured trace files 112 for decoding. The trace file store 110 can reside on a personal computer (PC) or on a network server that can be accessed by the decoder engine 120. The trace file 112 is typically in either hexadecimal or binary format that is generated by the Network Element (NE) undergoing investigation.

Figure 2A:
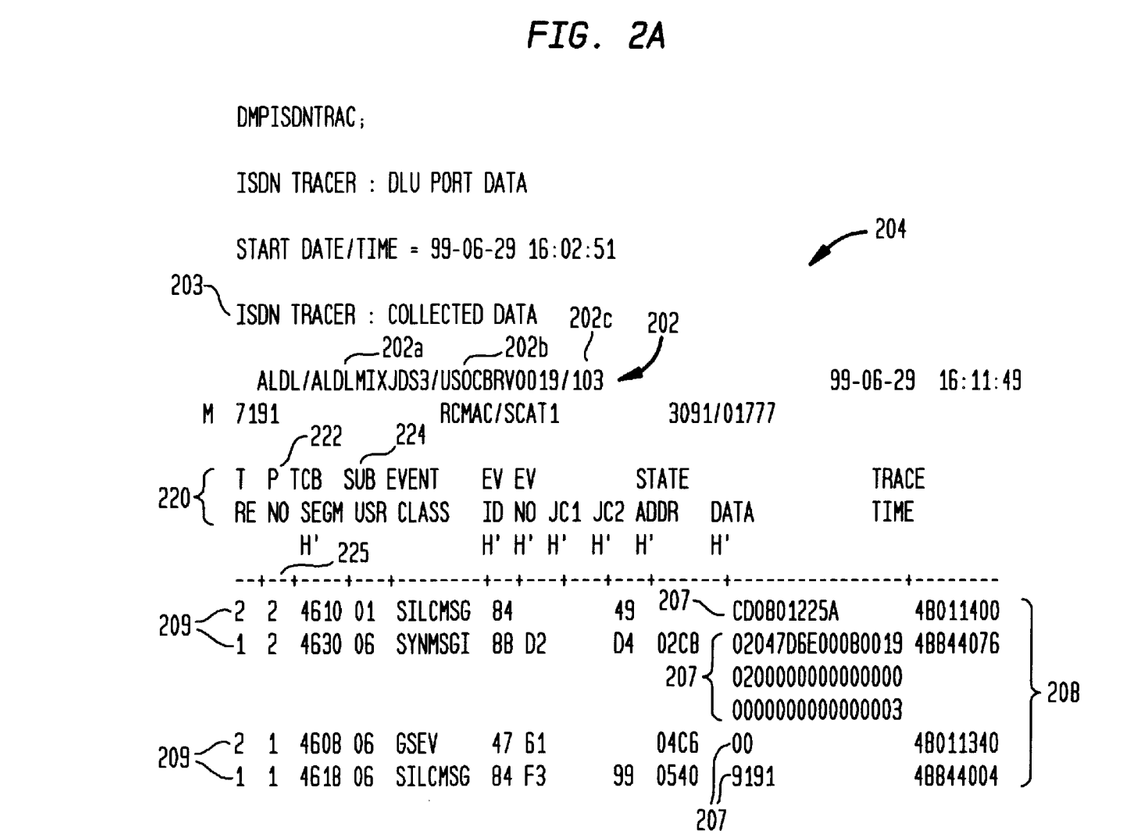
FIG. 2A is a first example of a trace that is output from a network element (NE) such as a Siemens Corporation EWSD telephony switch.
Figure 2B:
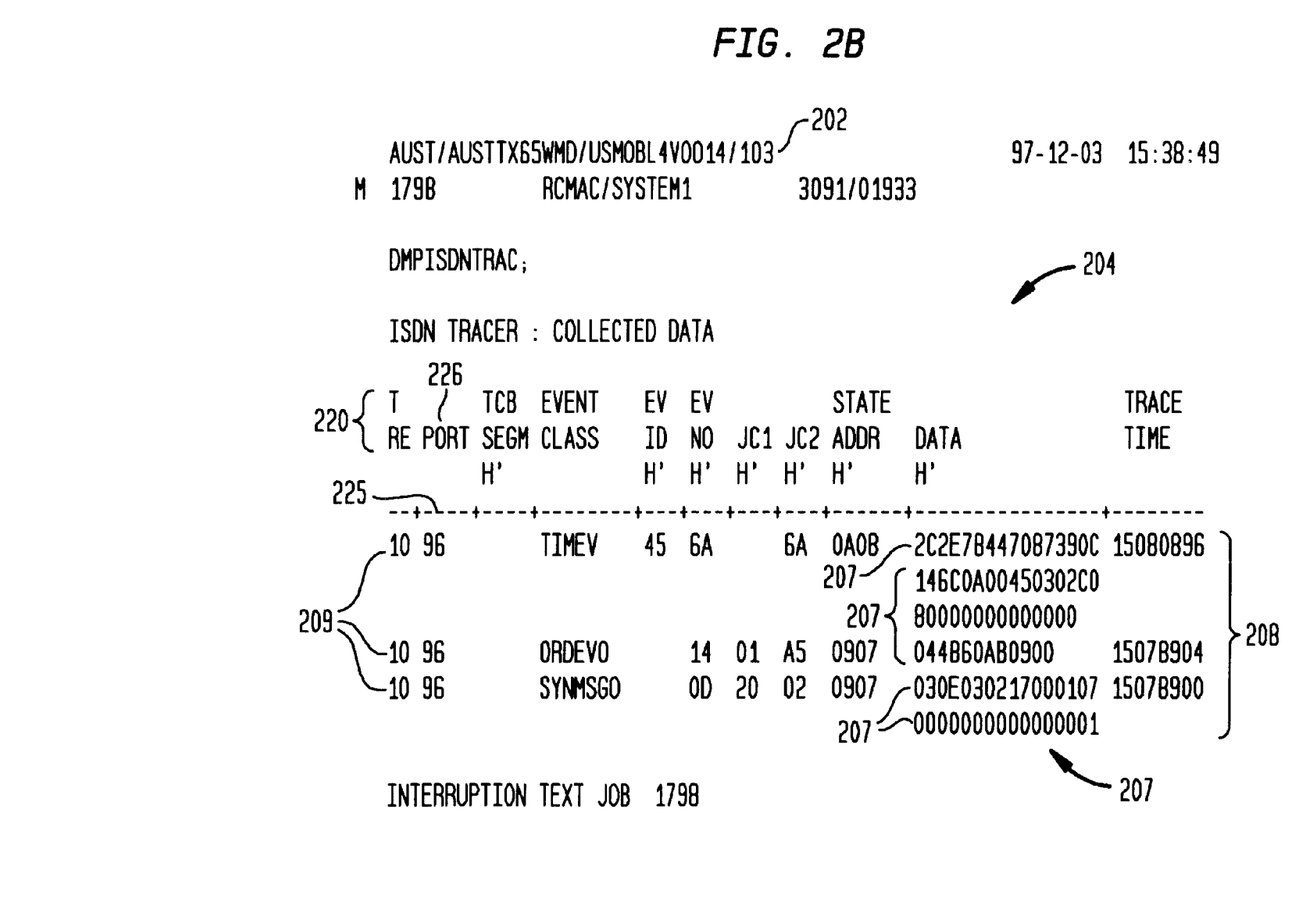
FIG. 2B is a second example of a trace similar to the trace in FIG. 2A but having a different event header format.

FIGS. 2A and 2B are abbreviated examples of the contents of Integrated Services Digital Network (ISDN) traces generated by the Siemens EWSD telephony switch. Both traces differ slightly in the event header format. As shown, traces 204 consist of a time sequence 208 of trace events, where each trace event is a sequence of byte codes 207. Similar traces 204 from the same NE can have different formats. For example, the traces in FIGS. 2A and 2B have different formats, with the difference in these figures being primarily in the headers 220 that precede the event data 204. FIG. 2A has "P NO" 222 and "SUB USR" 224, whereas FIG. 2B has only "PORT" 226. Furthermore, the data field offsets to the event data header fields 220 are different. Differences such as these in the structure and format of the headers 220 conveys essential information to the decoder engine and must be recognized by the system of FIG. 1 in order for the decoder engine to decode the trace information properly.

Figure 5A:
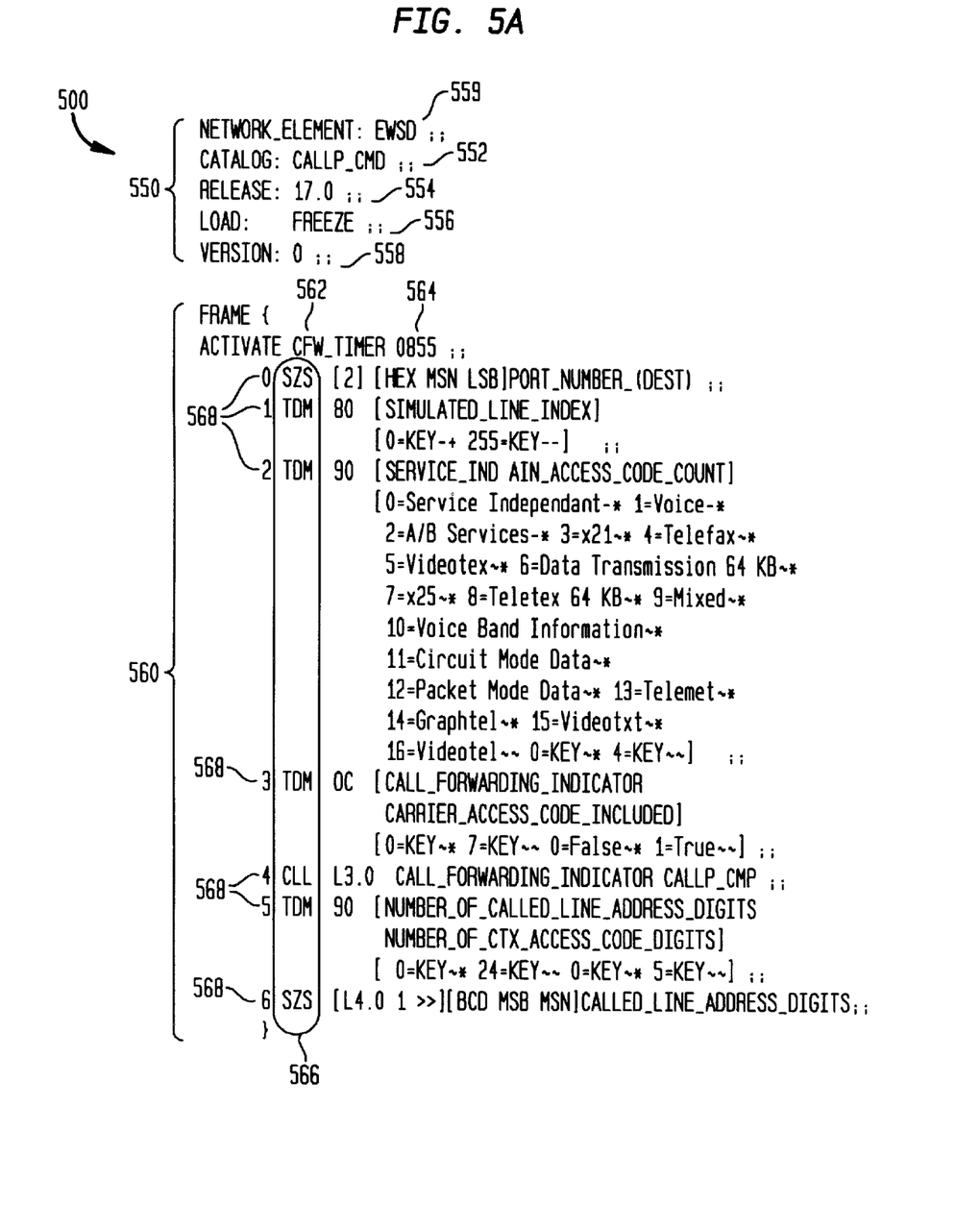
FIG. 5A is an example of a catalog frame generated by the Catalog Definition Language (CDL) code generator.
Figure 5B:
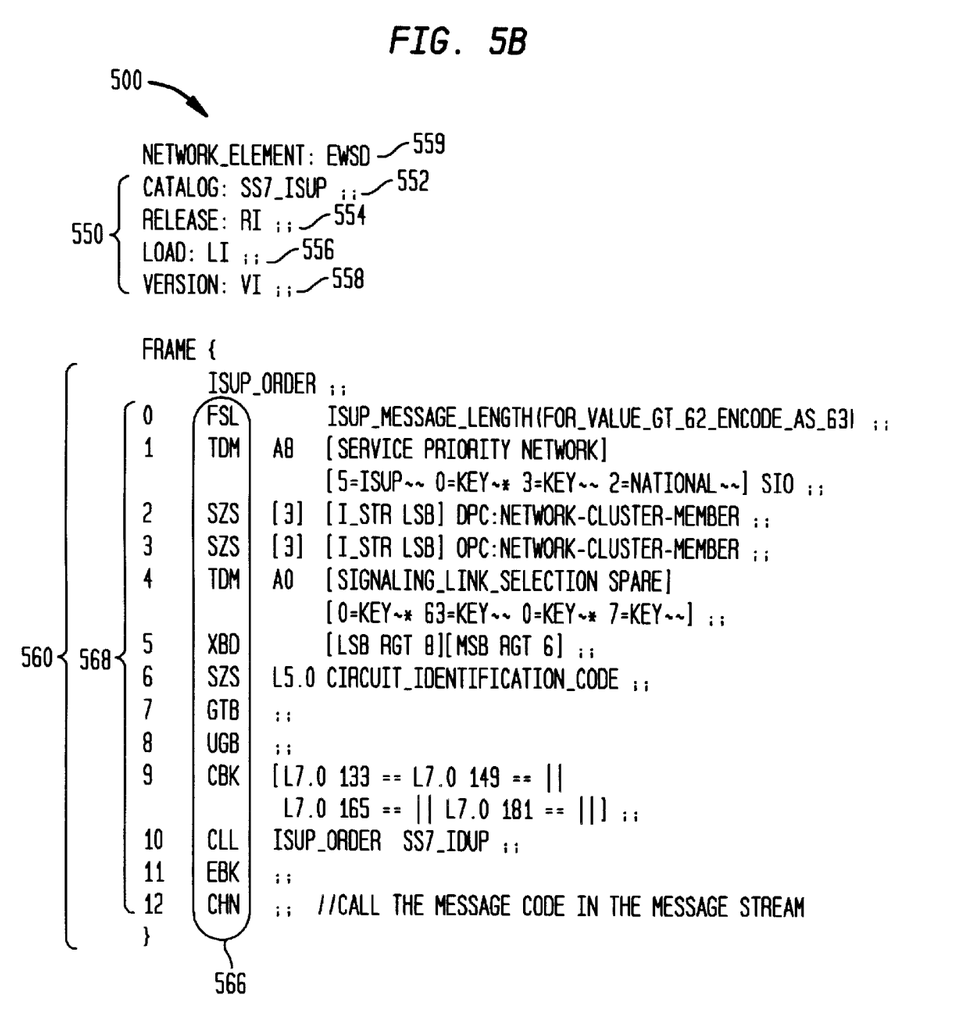
FIG. 5B is an example of a catalog frame created manually.

A trace file 112 from trace file store 110, similar in format to that shown in FIGS. 2A and 2B, is selected and provided as input to the decoder engine 120 shown in FIG. 1. The user selects the trace file 112 from the file store 110 using the Graphical User Interface (GUI) 130. The decoder engine 120 retrieves the trace file 112 from the file store 110 and determines the type 202 and format 225 of the trace to be decoded and the corresponding arrangement of the offsets 225 as shown in FIGS. 2A and 2B. To capture the differences in tracer type and trace file formats, "signatures" are used. A signature 202 consists of a text string 202a, the starting position of the signature value in a line of the trace file 202b, and the length of the signature value 202c. The user has the option of specifying the type of trace 203 and related properties such as product type (e.g., the NE) 559, release 554, operating system (OS) load 556, and version 558 (as shown in FIGS. 5A and 5B, described in more detail below) using the graphic user interface (GUI) 130. Typically, the user selects the product type 559 if the integrated trace analysis system has been configured to support multiple NEs. The decoder engine 120 also has the capability to do an "auto-find" for the other tracer properties. Although the simplest approach to identifying information such as the release 554, OS load 556, and version 558 is to have the user specify this information, this kind of information can also be included within the trace and automatically detected using signatures 202. The auto-find mechanism simply scans lines in order to find the required signatures. In a preferred embodiment, scanning is not done in a character-by-character fashion, but by indexing into lines at particular offsets that are predefined for each of the required signatures. However, if the release 554, OS load 556, and version information 558 is not included in the trace, then the user selects these properties using the GUI 130.

Figure 3:
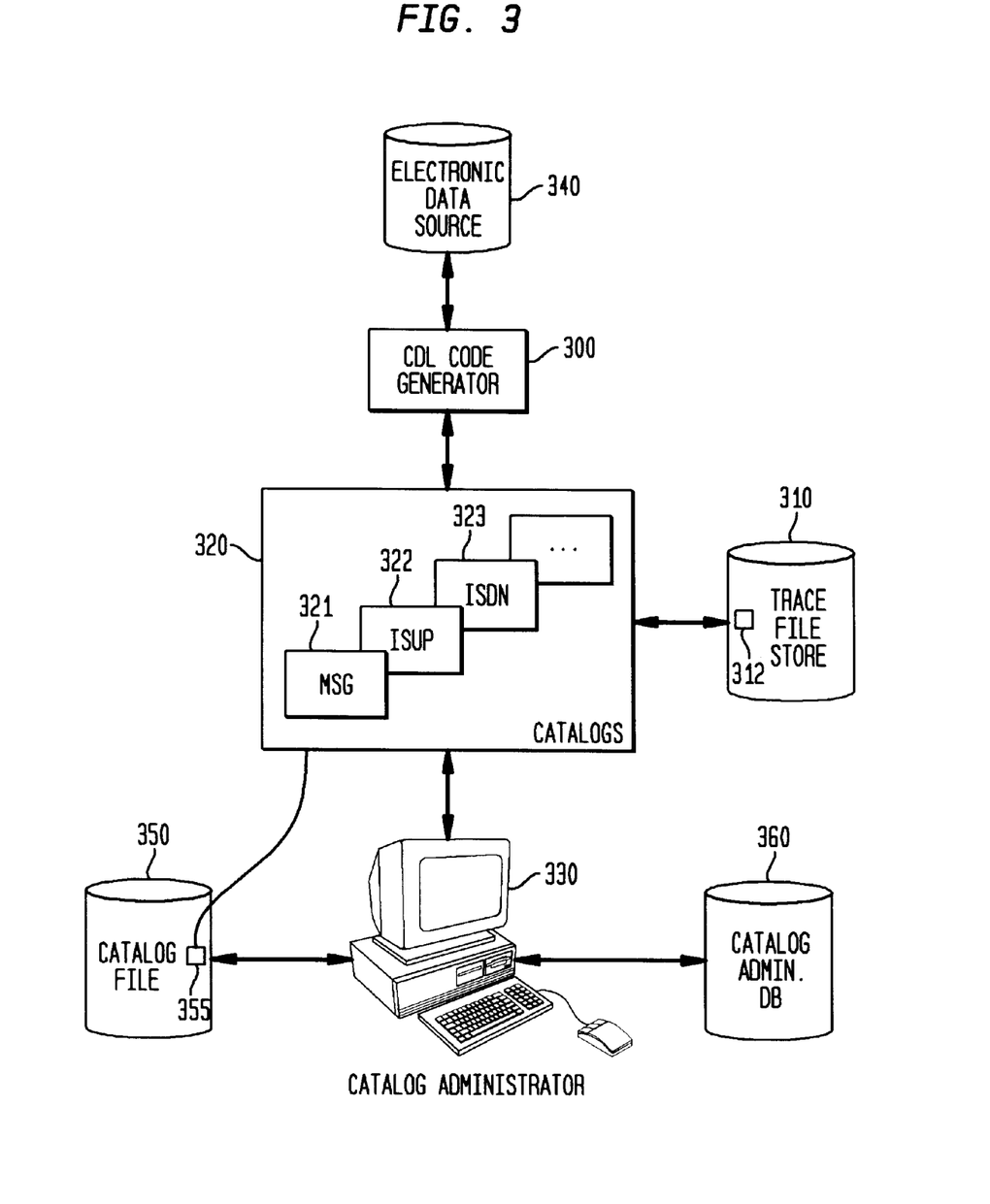
FIG. 3 is a block diagram of the encoding and file store subsystem required to generate and store catalogs.

FIG. 3 shows the integrated catalog encoding and file store subsystem in more detail. To perform the decoding function, the decoding engine 120 requires encoded catalogs such as 321, 322 and 323 that it determines, selects and compiles. These catalogs would have already been generated by and stored in the catalog encoding and storage subsystem 340. While only three catalogs 321, 322 and 323 are shown, those skilled in the art will recognize that this is merely illustrative and that there will be a plurality of catalogs. The decoder engine 120 scans and extracts the events 204 from the trace. For each event 209, the decoder engine 120 determines one or more of the catalogs 321, 322 and 323 to be used, and the particular frame 560, shown in FIGS. 5A and 5B, in the catalog to be executed.

As shown in FIGS. 5A and 5B, a frame 560 is a subprogram or subroutine of the respective catalog 321, 322 and 323. For each byte or group of bytes 207 in an event 209 (shown in FIGS. 2A and 2B) that is to be decoded, the decoder engine 320 executes the instructions contained in the bytes 207, in the form of op-codes 466, within the appropriate catalog frame. Thus, for each byte or group of bytes 207 within the corresponding event 209, there are corresponding instructions in the frame 560 to effect the decoding of the event byte codes 207. As the event byte codes 207 in the trace file 312 are decoded, the decoder engine 320 passes the results of the decoding to the GUI 330 for presentation to the user.

Figure 4:
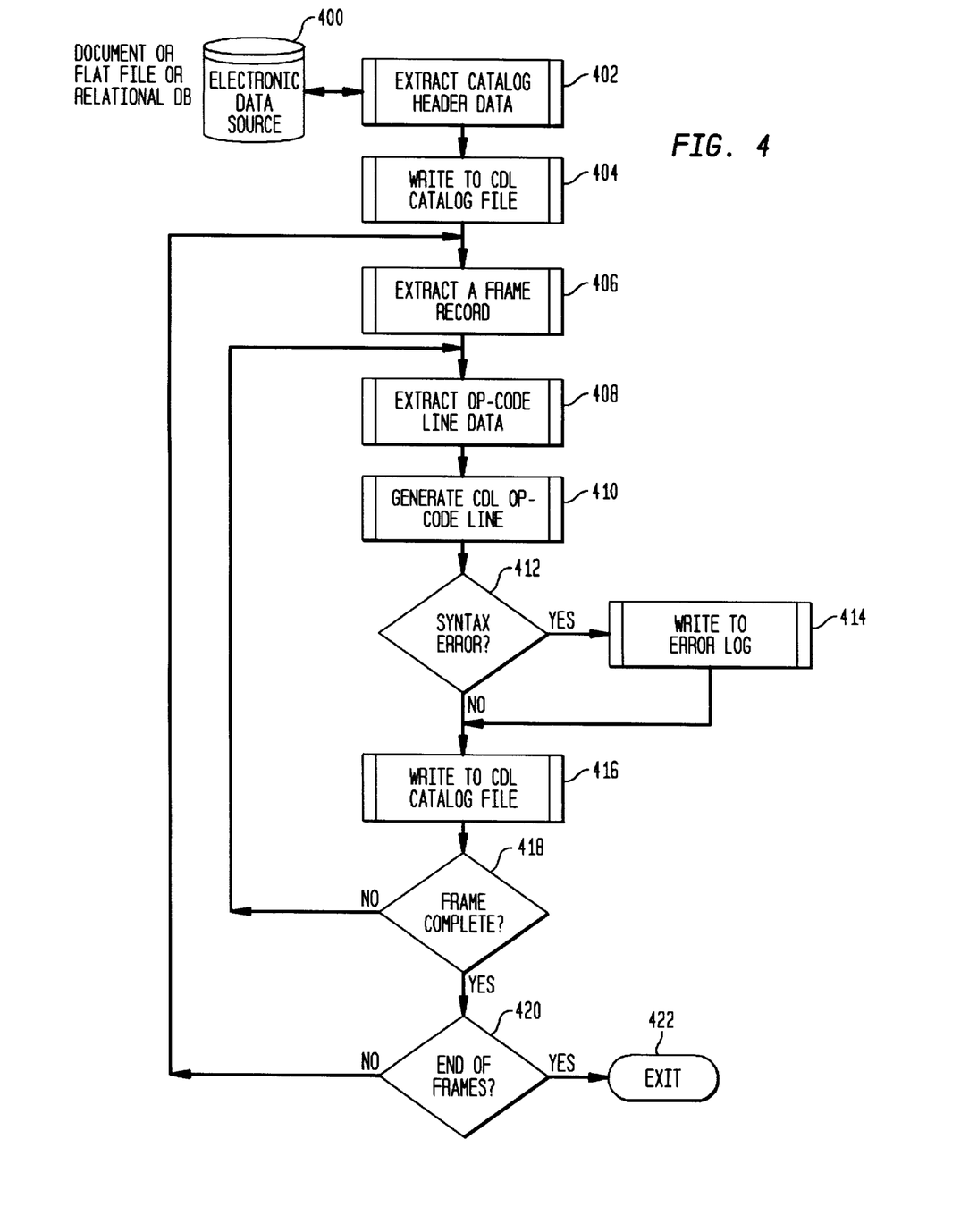
FIG. 4 is a more detailed block and flow diagram showing the process of the catalog code generator method.

The catalog encoding subsystem is essential to the decoding process. While catalogs can be manually encoded and stored in a file system as one alternative, the other alternative is to create catalogs using a CDL generator if the information needed for encoding pre-exist in an electronic data source format. FIG. 4 illustrates a more detailed and generic method for the automated encoding of CDL catalogs. The coding used to extract catalog and frame information from the data source is dependent on the type and format of the electronic data source 400. The method obtains the catalog header data in function block 402 from the data source 400, writes it to the CDL catalog file in function block 404 and enters the main processing loop by extracting frame records in function block 406. For each extracted frame record, the data is parsed to determine each op-code line in function block 408. For each op-code line determined, the CDL syntax for the determined op-code is generated in function block 410. If a syntax error is detected as determined in decision block 412, then in function block 414 an error description in conjunction with the frame name and line number is written to an error log file that is subsequently used to correct the error. Each generated op-code line for the frame is written to the CDL catalog file in function block 416. A test is made in decision block 418 to determine if the frame is complete. If not, the process loops back to function block 708 to extract op-code line data. If the frame is complete, a further test is made in decision block 420 to determine if the end of the frames has been reached. If not, the process loops back to function block 706 to extract the next frame record. In this way, the process continues for every op-code that belongs to a record and for every frame that is extracted until al frames are retrieved and catalog generation is complete and the process exits at 420. Those skilled in the art will recognize that the generic method described here can be modified to achieve the same or similar result. Furthermore, more than one code generator may be needed, depending on the electronic data source.

The encoding and file store subsystem 340 creates, modifies and stores catalogs 321, 322 and 323. Catalogs as a rule do not remain static but evolve over time as NEs are updated with new software or as existing software is patched on the NE. Thus, there is a need to dynamically evolve catalogs over time. Some catalogs may require more frequent changes than other catalogs. Typically, industry standard protocols evolve more slowly and are usually backwardly compatible. However, the same does not usually apply to proprietary protocols which can change more frequently and are not guaranteed to be backwardly compatible. The encoding and file store subsystem 340 can automatically generate some catalogs, such as 321 and 323 that are shown. Factors that would influence whether the code generator 300 is utilized or whether the catalogs are manually encoded depends on the complexity of the protocol, and the complexity of the expression of the protocol in the Catalog Definition Language (CDL). The CDL that is used in defining and expressing catalogs is disclosed in co-pending patent application Ser. No. 09/540,184. Examples of a catalog frame generated by the CDL code generator 300 created and a manually created catalog frame are provided in FIGS. 5A and 5B, respectively. Manual encoding of catalogs, such as 322, as shown in FIG. 5B, can be more efficient for more complex industry standard protocols that are not subject to a high rate of revision frequency and which are also backward compatible. Industry standard protocols (e.g., SS7, ISDN, etc.) tend to be complex and have a low revision frequency rate and thus tend to be more efficiently handled using manual encoding and minor editing as changes occur. Using the code generator 300 is generally preferred for less complex protocols that, in addition, may also have a high revision frequency rate (e.g., the call processing protocol, CALLP, in the Siemens EWSD telephony NE). If the electronic data source of the electronic file store subsystem 340 does not contain information sufficient to create catalogs 321 and 323, then the catalogs can be manually encoded by using, for example, a text editor. The electronic data source of the encoding and file store subsystem 340 may exist, for example, as an electronic document, as a flat file, or as a relational database (DB). To automatically generate catalog 322, code generator 300, preferably written in a high level programming language (e.g., PERL, C, C++, Java, etc.), accesses the electronic data source of the encoding and file store subsystem 340, reads a data record of interest, and determines the required frames 560 and op-codes 566, as shown in FIGS. 5A and 5B. The code generator 300 creates catalog 321, 322 and 323 using the management and administration functionality within the integrated trace analysis system that is available only to an administrator via the GUI 330.

The decoder engine 120 utilizes a convention for expressing catalog file names 324 and for finding catalogs 321, 322 and 323 within the catalog file system 350. Catalog file names stored within the catalog file system 350 are preferably identified using the name of a protocol class and the name of a sub-protocol class or an event class. For example, the SS7 protocol class has a sub-protocol class of ISUP, giving a catalog name, for example, of SS7_ISUP. Similarly, for a Siemens EWSD NE, a catalog name could be, for example, CALLP_MSG where CALLP is the protocol class and MSG is the message event class. As shown in FIGS. 5A and 5B, it is preferred that tracer properties, such as network element 559, release 554, OS load 556, version 558, catalog name 552 and a root directory name be used to find a catalog 321, 322 or 323 within the library of catalogs 355 of catalog file system 350.

Thus, for example, if the root directory name is C:/iTAS and the tracer properties are network element=EWSD, release=17.0, load=Freeze, Version=0, and Catalog Name= CALLP_CMD, as shown at 450 and 459 in FIG. 4A, then the path to the CALLP_CMD catalog would be:

Path=C:/iTAS/EWSD/17.0/Freeze_0/CALLP_CMD.

As shown in FIGS. 5A and 5B, when configured for multiple product support, the catalog header 550 will also contain the NE 559 (e.g., EWSD). Each catalog has a set of frames wherein a frame 560 has a name 562 and optionally has a frame code 564. Within each frame 560 there is an ordered set of instructions or op-codes 566. Each op-code is numbered 568, preferably in ascending order, and may have one or more arguments as required by the syntax for the op-code. The catalog utilizes the CDL disclosed in co-pending patent application Ser. No. 09/540,184 to express the contents of a catalog. The catalogs 321, 322 and 323 are preferably stored in the catalog file 350. The catalog administration database 360 provides the functionality that is required to manage a library of catalogs stored in a file system by enabling the user to locate a particular catalog 321, 322 and 323 within the catalog file system 350 and by identifying such information as who created the particular catalog, who modified the catalog, what versions of the catalog exist, etc.

Figure 6:
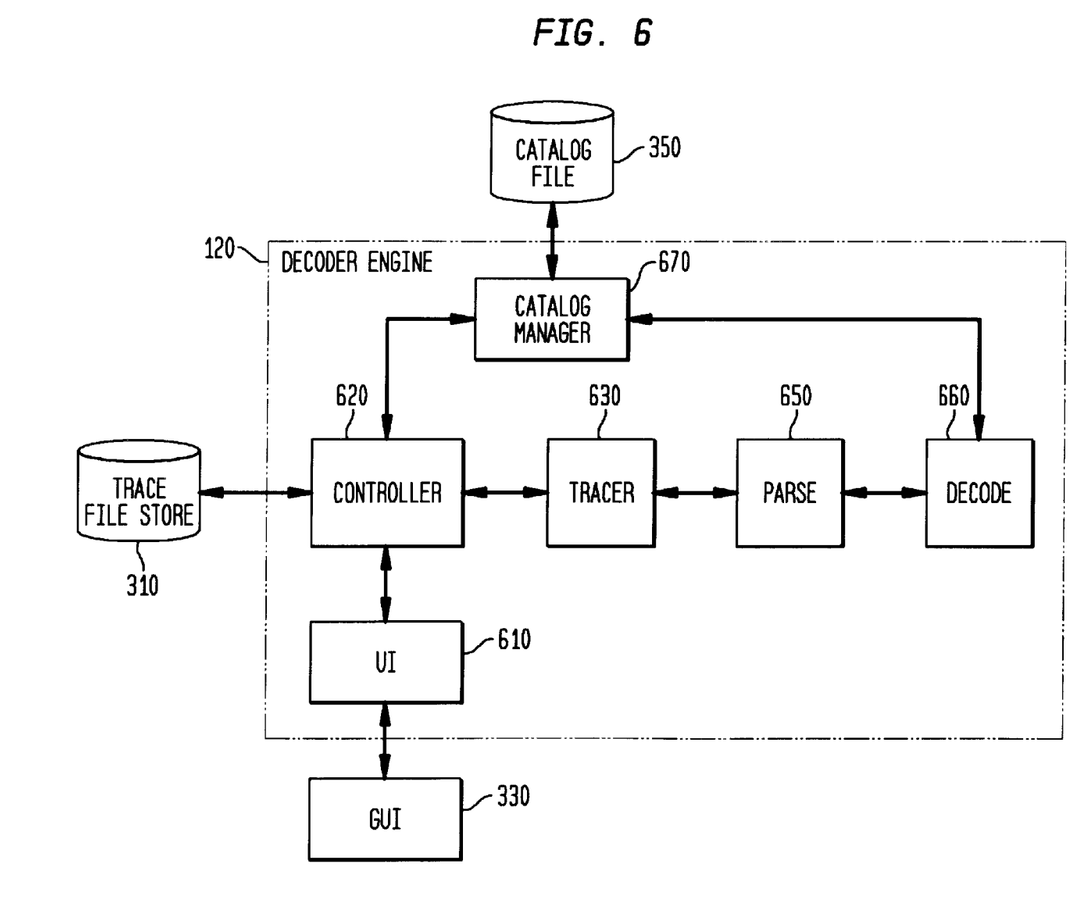
FIG. 6 is a block diagram showing in more detail the decoder engine shown in FIG. 1.

FIG. 6 is a block diagram of the decoder engine 120 shown in FIG. 1. The decoder engine 120 consists of the session manager 610, controller 620, tracer 630, catalog manager 670, parser method 650, and decoder 660.

With reference to FIGS. 3 and 6, the user interface 610 acts as a bridge between the controller 620 and the GUI 330. GUI 330 receives user input, and presents the results of decoded traces. The inputs to the session manager (SM) 610 are the requests made from the GUI 330. The input requests can be, for example, to extract event data 206 or decode event data 206 (shown in FIGS. 2A and 2B) within a trace file, filter decoded information, search for strings, etc. The data elements provided to the session manager (SM) 610 are typically a trace file name to be operated on, the location of the trace file within the trace file system 310, and the trace file properties 650 and 559 (either user-provided or provided using the auto-find feature previously discussed), as shown in FIGS. 5A and 5B.

The SM 610 stores the request provided by the user and trace properties given to it by the GUI 330 and, when initially invoked, the SM 610 component creates, preferably in accordance with object-oriented programming techniques well known to those skilled in the art, a controller 620. The SM 610 then passes references to the request and data elements that it received to the controller 620. The controller 620 retrieves the trace file 312 from the trace file store 310, identifies or verifies the type of tracer 630 and format 225 (FIG. 2A) of the trace file 312, and determines the tracer properties 500, 559 (FIGS. 5A and 5B). In addition, the controller 620 creates the tracer 630 based on tracer properties, preferably in accordance object-oriented programming techniques widely known to those skilled in the art, and creates a set of signatures to be utilized by the parser method 650 associated with tracer 630.

The controller 620 also scans the trace file 312 to determine the trace format 225 (each tracer format has a unique list of signatures), creates the catalog manager 670, preferably in accordance with object oriented programming techniques well known to those skilled in the art, and directs and constrains the catalog manager 670 to utilize only the set of catalogs 321, 322 and 323 that will provide the most accurate decoding as determined from the tracer properties.

In a preferred embodiment, a rating algorithm stored in the catalog manager 670 determines either the exact catalog set 321, 322 and 323 to be utilized or the "closest-fit" catalog set that will provide the next best level of decoding accuracy. Finally, upon creation of the catalog manager 670, the controller 620 preferably directs the catalog manager 670 to make the most frequently used subset of the identified catalog set to be run-time memory resident. This is preferably done only for any of catalogs 321, 322 and 323, etc., from the subset of catalogs that are not already memory resident. The subset of catalogs that is initially required to be memory resident is determined from the tracer class (that is, tracer type). Other less frequently used catalogs are loaded when needed by the decode method of the tracer component.

The controller 620 utilizes trace signatures to identify or verify tracer class, an example of which is ISDN, and trace file formats 225, of which two examples are shown in FIGS. 2A and 2B. By utilizing signatures, it becomes feasible to easily represent a plurality of tracers and trace file formats. When the controller 620 identifies the tracer class and trace file format 225, it creates, preferably in accordance with object-oriented programming techniques widely known to those skilled in the art, the appropriate tracer 630 with the correct set of signatures for parsing the trace file 312, and directs the tracer 630, via the parser method 650, to decode each tracer event within the trace file 312.

The inputs to the tracer 630 are references in the form of pointers to the catalog manager 670, which is responsible for obtaining the necessary catalogs from the catalog file system 350, the trace file 312, a variable to store the output results from the tracer, the trace file size and current line number in the trace file to start parsing from, the state of the tracer (which can either be to start parsing or to continue parsing until the end of the trace file), the signature set that the tracer is to use, and the next event to be parsed and decoded.

The inputs to the catalog manager 670 are requests to load, unload or reload specific catalogs 321, 322 and 323 in conjunction with to the catalog name 324 (e.g., MSG, ISUP, ISDN). From the catalog name and tracer properties such as release 554, OS load 556 and version 558 (as shown in FIGS. 5A and 5B), the catalog manager 670 determines the location in the encoding and file store subsystem 340 and retrieves it if the request was to load or reload. The difference between load and reload is that a load request will cause an unconditional load of the catalog even with unloading of the same catalog 321, 322 and 323, if required. The reload request is a conditional load request and will not cause an automatic load if the correct catalog 321, 322 and 323 is already memory resident. This distinction allows run-time and off-line catalog compilation testing to verify correct catalog syntax. In both types of request, the constraints placed on the catalog manager 670 in loading catalogs are never violated. The request to load a subset of catalogs (e.g., 321 and 322) is made initially by the controller 620. The reload request for a catalog is made typically by the decoder 660 associated with a tracer 630.

In a preferred embodiment, catalogs 321, 322 and 323 are lazily bound (i.e., the linkages between catalogs are not computed until runtime and are only dynamically linked if required). These attributes of catalogs 321, 322 and 323 Support modification and evolution of catalog libraries 325 since it is not necessary to recompile code that use the catalogs 321, 322 and 323. When loaded, a catalog 321, 322 or 323 is compiled, and references between frames in the catalog 321, 322 and 323 are resolved. Lazy binding occurs between catalogs 321, 322 and 323 should an instruction in one of the catalogs 321, 322 and 323 reference another. Lazy-binding only occurs if needed by the runtime decoding engine. Since catalogs 321, 322 and 323 are not hard coded into compiled code, lazy-binding allows runtime modification to the catalog 321, 322 and 323 library without affecting users. The output from the catalog manager 670 is either a reference to the location of a catalog set 355 or a Boolean value to indicate that a particular catalog 321, 322 or 323 was successfully or unsuccessfully loaded into a catalog set.

The reference to a catalog set 355 is typically provided to the controller 620 whereas the Boolean value is typically returned to the decode method 660.

The input values passed to the tracer 630 are also made available to the parser method 650. The parser method 650 scans and extracts events 206 from the trace file 312 and passes each extracted event 206 (FIG. 2A) to the decode method 660. If the catalog 321, 322 or 323 required by a given event 206 is not memory resident, then the decode method 660 directs the catalog manager 670 to make the catalog memory resident. The catalog manager 670 is at liberty to load, unload or reload catalogs depending on memory resource utilization. Whenever the catalog manager 670 loads or reloads a catalog 321, 322 or 323 for a particular decoding session, it does so using the reference to the location of the catalog set 355 that was previously given to the controller 620 upon creation of the catalog manager 670.

Figure 5C:
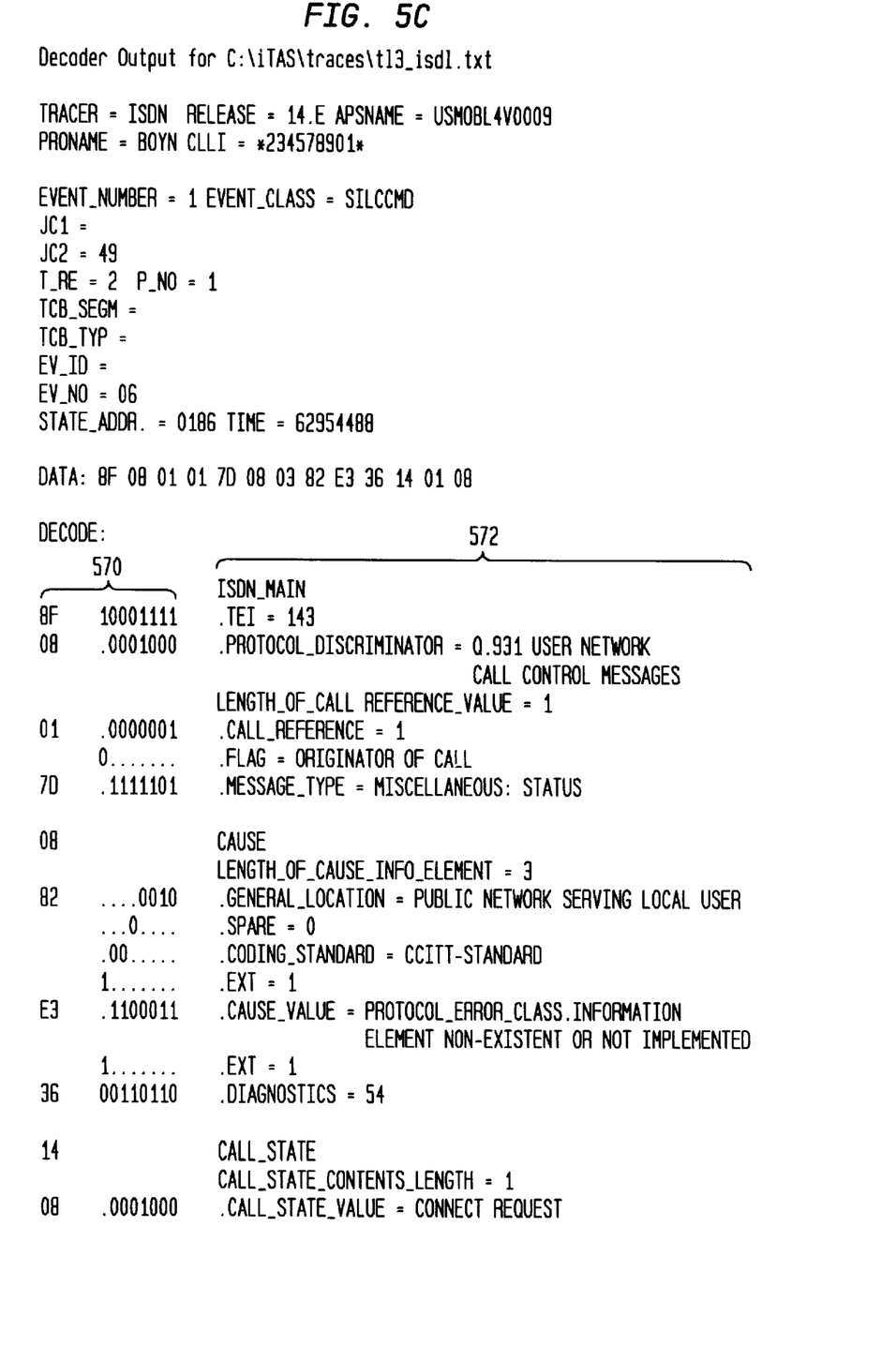
FIG. 5C is an example of a screen display of the decoded trace output of frames.

FIG. 5C illustrates the extracted event data 570 and decoded event data 572. The output results 572 are passed back, using the variable assigned to store output results, to the controller 620 and then the SM 610 to the GUI 330. A request can be made via the GUI 330 to extract only the trace event data 206 without decoding. In this instance, only the trace header 220, event header 202 and event data 206 is extracted.

Figure 7:
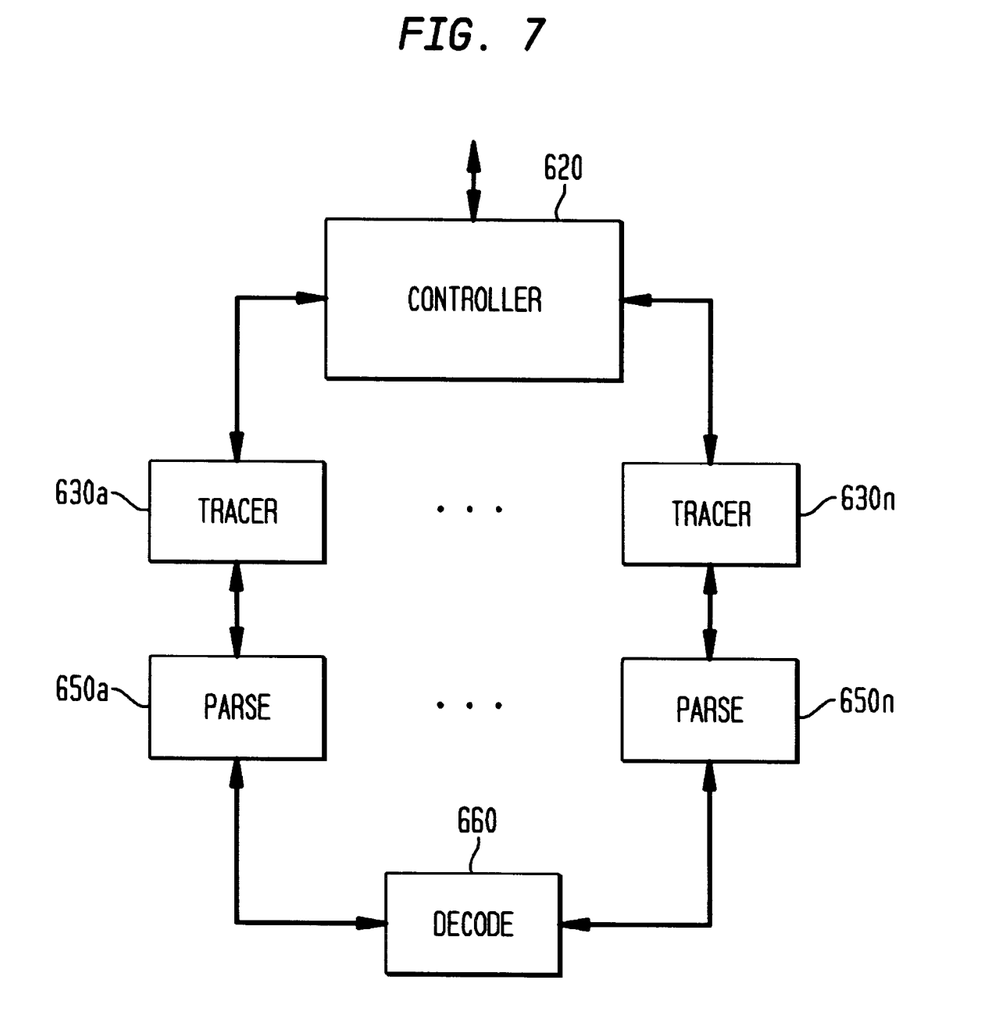
FIG. 7 illustrates a plurality of tracer classes that the decoder engine is capable of handling.

FIG. 7 illustrates a plurality of tracer classes 630a, 630n that the decoder engine 320 is capable of handling. This is made possible by the CDL that allows a single decoder 660 to handle a plurality of tracers. The plurality of trace formats is handled by the use of signatures that uniquely identify each format. The controller 620 identifies this format and passes a reference to the set of signatures required to parse the trace.

For each tracer class, a unique tracer 630a, 630n is created, preferably using object-oriented programming techniques well known to those skilled in the art. All tracers 630a, 630n utilize the same decoding method that is the core of the decoder engine 120 based on the catalog definition language (CDL). Typically, there is a specific and unique parser method 650a, 650n for each tracer class 630a, 630n, respectively. Alternatively, a single parser method can be used to parse a subset of tracers where the tracer output format is similar and only differs based on the signature set that the parser method 650 utilized to extract event byte codes from the trace file. The signature set utilized by the parse method is specifically defined for the tracer class and given to the parse method 650a, 650n as one of its input values.

The text field may or may not be the name of the signature value to be extracted from a given line position within the trace file 312, and this depends on the coding logic of the particular parse method. When an extraction of a signature value is made, the length of the signature field is used. For example, in FIG. 2A, the first data entry 207 is located at offset number 49 and has a length of 16 characters. Furthermore, depending on the coding logic of the parsing method, a signature can be defined to consist of the ordering of one or more signatures. This permits the parsing logic, which is unique to each tracer or to each group of closely related tracers, to scan for specific patterns over multiple lines in the trace file 312. The signature set to be utilized is created by the controller 620 when the controller 620 identifies or verifies the tracer class and the trace file format used by the tracer class. An initialization method of the identified signature class is used to create the set of signatures to be used. Thus, the signature definitions are coded within the signature set creation methods.

Given this disclosure, alternative equivalent embodiments will become apparent to those skilled in the art. These embodiments are also within the contemplation of the invention. Thus, while the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A system for decoding telecommunication tracer information originating from any telecommunication network element and utilizing any commercial or proprietary telecommunication protocol, comprising:

a storage repository for storing trace data, wherein the trace data is comprised of a plurality of individual events provided by a telecommunication network element that utilizes a particular telecommunications tracer;

an encoder that creates and stores a plurality of executable programs used to decode the trace data;

a decoder engine that receives trace data from said storage repository, determines a telecommunication protocol associated with the trace data, and invokes one or more executable programs stored in the catalog encoder to decode the trace data; and     a graphical user interface that receives an output from said decoder engine and displays the decoded results.

2. The system for decoding telecommunication tracer information originating from any telecommunication network element as recited in claim 1, wherein said decoder engine further comprises:

a controller for determining the telecommunications protocol associated with the trace data;

a tracer that emulates a network element tracer from which the trace data is generated;

a parser for extracting events from the trace data and passing each extracted event to a decoder;

a decoder for receiving extracted events from said parser and accessing an executable program to decode the trace;

a catalog manager that stores or retrieves one or more executable programs for decoding trace data from a catalog library file system; and     a user interface that transmits a user request to said controller and transmits decoded results to said GUI.

3. The system for decoding telecommunication tracer information originating from any telecommunication network element as recited in claim 1, wherein said encoder comprises:

an electronic data source that contains information required to define catalogs of interest;

a code generator that reads data from said electronic data source and utilizes the data to produce an executable program; and     a catalog file that includes the executable program generated by said code generator.

4. The system for decoding telecommunication tracer information originating from any telecommunication network element as recited in claim 1, wherein said storage repository stores data in hexadecimal format.

5. The system for decoding telecommunication tracer information originating from any telecommunication network element as recited in claim 1, wherein said storage repository stores data in binary format.

6. The system for decoding telecommunication tracer information originating from any telecommunication network element as recited in claim 1, wherein the executable programs are comprised of a program description header information on a plurality of frames.

7. A method for decoding telecommunication tracer information originating from any telecommunication network element and utilizing any commercial or proprietary telecommunication protocol, comprising the steps of:

storing trace data, wherein the trace data is comprised of a plurality of individual events provided by a telecommunication network element that utilizes a particular telecommunications protocol or a plurality of protocols;

creating a plurality of executable programs used to decode the trace data;

decoding trace stored in said storing step by determining the telecommunication protocol associated with the stored trace data, and invoking one or more of the executable programs; and     providing the decoded trace results to an output.

8. The method for decoding telecommunication tracer information originating from any telecommunication network element as recited in claim 7, wherein said decoding step further comprises the steps of:

determining the telecommunications protocol associated with the trace data;

emulating a network element tracer from which the trace data is generated;

extracting events from the trace data;

decoding the extracted events using one or more executable programs; and     transmitting the decoded results to an output.

9. The method for decoding telecommunication tracer information originating from any telecommunication network element as recited in claim 7, wherein said creating step further comprises the steps of:

storing information required to create the executable programs;

accessing the stored information to generate an executable program; and     storing the executable programs generated by said accessing step.

10. The method for decoding telecommunication tracer information originating from any telecommunication network element as recited in claim 7, wherein said storing step stores data in hexadecimal format.

11. The method for decoding telecommunication tracer information originating from any telecommunication network element as recited in claim 7, wherein said storing step stores data in binary format.

* * * * *